(12) United States Patent
Fang et al.

(10) Patent No.: US 9,978,995 B2
(45) Date of Patent: May 22, 2018

(54) DISPLAY SUBSTRATE HAVING A BLACK MATRIX WITH A CURVED SURFACE, METHOD FOR MANUFACTURING THE SAME AND DISPLAY DEVICE

(71) Applicant: BOE TECHNOLOGY GROUP CO., LTD., Beijing (CN)

(72) Inventors: Jingang Fang, Beijing (CN); Wulin Shen, Beijing (CN); Hongda Sun, Beijing (CN); Chun I Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/306,886

(22) PCT Filed: Mar. 14, 2016

(86) PCT No.: PCT/CN2016/076253
§ 371 (c)(1),
(2) Date: Oct. 26, 2016

(87) PCT Pub. No.: WO2016/184234
PCT Pub. Date: Nov. 24, 2016

(65) Prior Publication Data
US 2017/0170433 A1    Jun. 15, 2017

(30) Foreign Application Priority Data

May 20, 2015   (CN) .......................... 2015 1 0259953

(51) Int. Cl.
*H01L 51/52*    (2006.01)
*H01L 51/56*    (2006.01)
*H01L 51/00*    (2006.01)

(52) U.S. Cl.
CPC ...... *H01L 51/5284* (2013.01); *H01L 51/5253* (2013.01); *H01L 51/5259* (2013.01); *H01L 51/56* (2013.01); *H01L 51/0004* (2013.01)

(58) Field of Classification Search
CPC ............. H01L 51/5284; H01L 51/5253; H01L 51/5256; H01L 51/56; H01L 51/0003–51/0007
See application file for complete search history.

(56) References Cited

U.S. PATENT DOCUMENTS 6,157,426 A * 12/2000 Gu .................... G02F 1/133512
                                                                    257/72
8,866,170 B2   10/2014 Moon et al.
(Continued)

FOREIGN PATENT DOCUMENTS

CN        104076549 A    10/2014
CN        104267518 A    1/2015

OTHER PUBLICATIONS

Alayo, M. I. et al. Deposition and characterization of silicon oxynitride for integrated optical applications. J. Non-Cryst. Solids, 338-340 (2004) 76-80.*
(Continued)

*Primary Examiner* — Thao X Le
*Assistant Examiner* — Gardner W Swan
(74) *Attorney, Agent, or Firm* — Armstrong Teasdale LLP

(57) ABSTRACT

A display substrate having a black matrix with a curved surface, a method for manufacturing the same and a display device are provided. The display substrate includes a black matrix disposed between adjacent pixels, wherein a sidewall of the black matrix is a concave curved surface. During the formation of a color film, since the sidewall of the black matrix is formed as a concave curved surface, color film droplets in one sub-pixel may return into the sub-pixel along the curved surface while splashing to the sidewall of the (Continued)

black matrix, thereby the contamination to adjacent pixels caused by the droplets splashing may be avoided, and a yield of the substrate may be ensured.

10 Claims, 3 Drawing Sheets

(56) References Cited

U.S. PATENT DOCUMENTS

| | | | |
|---|---|---|---|
| 9,373,814 B2* | 6/2016 | Liu | H01L 51/56 |
| 9,466,650 B2* | 10/2016 | Wang | H01L 51/0004 |
| 2007/0172774 A1* | 7/2007 | Limb | G03F 7/0007 |
| | | | 430/322 |
| 2007/0172969 A1* | 7/2007 | Wong | B41M 3/003 |
| | | | 438/22 |
| 2015/0303406 A1* | 10/2015 | Kim | H01L 51/5256 |
| | | | 257/40 |
| 2015/0362644 A1* | 12/2015 | Tian | G02B 5/201 |
| | | | 359/891 |
| 2016/0276623 A1* | 9/2016 | Onimaru | G02B 5/201 |
| 2016/0377901 A1* | 12/2016 | Yen | G02F 1/13394 |
| | | | 359/891 |

OTHER PUBLICATIONS

English Translation of PCT (CN) International Search Report, Application No. PCT/CN2016/076253, dated Jun. 16, 2016, 3 pps.
PCT (CN) Written Opinion, Application No. PCT/CN2016/076253, dated Jun. 16, 2016, 4 pps.
English Translation of PCT (CN) Written Opinion, Application No. PCT/CN2016/076253, dated Jun. 16, 2016, 2 pps.

* cited by examiner

DISPLAY SUBSTRATE HAVING A BLACK MATRIX WITH A CURVED SURFACE, METHOD FOR MANUFACTURING THE SAME AND DISPLAY DEVICE

CROSS REFERENCE TO RELATED APPLICATIONS

This application is a National Stage entry of PCT/CN2016/076253 filed Mar. 14, 2016, which claims priority to Chinese Patent Application No. 201510259953.4 filed on May 20, 2015, the disclosures of which are incorporated by reference herein in their entirety as part of the present application.

BACKGROUND

Exemplary embodiments of the present disclosure relate to a display substrate having a black matrix with a curved surface and a method for manufacturing the same, and a display device.

In the field of the active-matrix organic light emitting diode (AMOLED) display, because of advantages of high response speed, high color gamut, high contrast, wide viewing angle, ultra-thin, low power consumption and so on, the AMOLED display becomes the hot spot of modern display research.

In particular, since light is emitted from the other end of the active matrix and the light emission of the OLED is not blocked by a metal wiring, a white OLED (WOLED) display with a top emission structure has the advantage of a high aperture ratio. In the case of the AMOLED with a top emission structure, a color film can be directly formed on the OLED based on the printing process which can avoid the impact caused by a UV (ultraviolet light) on the OLED. A black matrix (BM) in the color film has a thickness of higher than 1 μm and a slope angle that is generally between 30 to 60 degrees (shown in FIG. 1). However, compared with the OLED manufactured by traditional printing process in which the color film only needs a thickness of 200-300 nm, the thickness of the color film should be up to a micron level to ensure a color saturation. The droplet used for printing the color film is larger, thus splashing of the droplets in the direction of the slope of BM is more likely to occur, which can easily cause contamination between adjacent pixels.

BRIEF DESCRIPTION

Embodiments of the present disclosure provide a display substrate having a black matrix with a curved surface and a manufacturing method thereof and a corresponding display device, so as to avoid contamination to adjacent pixels caused by droplets during a color film printing.

According to a first aspect of the present disclosure, a display substrate is provided, which includes a black matrix disposed between adjacent pixels, wherein a sidewall of the black matrix is a concave curved surface.

According to an embodiment of the present disclosure, a material of the black matrix includes a negative photoresist.

According to an embodiment of the present disclosure, the black matrix includes a first insulating layer, a second insulating layer disposed on the first insulating layer, a third insulating layer disposed on the second insulating layer, and a light shielding layer disposed on the third insulating layer, wherein an etching rate of the first insulating layer is greater than an etching rate of the second insulating layer, and wherein the etching rate of the second insulating layer is greater than an etching rate of the third insulating layer.

According to an embodiment of the present disclosure, the black matrix further includes a lower second insulating layer disposed under the first insulating layer, and a lower third insulating layer disposed under the lower second insulating layer.

According to an embodiment of the present disclosure, the first insulating layer, the second insulating layer and the third insulating layer are etched by a dry etching process. Alternatively, the first insulating layer, the second insulating layer, the third insulating layer, the lower second insulating layer and the lower third insulating layer are etched by a dry etching process.

According to an embodiment of the present disclosure, the first insulating layer is formed by a silicon nitride, the second insulating layer is formed by a silicon oxynitride, and the third insulating layer is formed by a silicon oxide. Alternatively, the first insulating layer is formed by a silicon nitride, the second insulating layer and the lower second insulating layer are formed by a silicon oxynitride, and the third insulating layer and the lower third insulating layer is formed by a silicon oxide.

According to an embodiment of the present disclosure, the display substrate further includes an encapsulation layer disposed under the black matrix for encapsulating an organic light emitting diode, and a blocking layer disposed between the black matrix and the encapsulation layer for preventing the encapsulation layer from being etched by a dry etch process.

According to an embodiment of the present disclosure, the display substrate further includes an absorbing layer disposed on the black matrix for absorbing an organic solvent, water and/or a liquid for forming sub-pixels.

According to a second aspect of the present disclosure, a display device including the display substrate described as above is also provided.

According to a third aspect of the present disclosure, a method for manufacturing a display substrate is also provided, which includes forming a black matrix between adjacent pixels, such that a sidewall of the black matrix is a concave curved surface.

According to an embodiment of the present disclosure, forming the black matrix between adjacent pixels includes forming a black matrix layer using a negative photoresist, heating the black matrix layer to dry an organic solvent in the black matrix layer, exposing the black matrix layer, and developing the black matrix layer to form the black matrix.

According to an embodiment of the present disclosure, forming the black matrix between adjacent pixels includes forming a first insulating layer, forming a second insulating layer on the first insulating layer, forming a third insulating layer on the second insulating layer, and forming a light shielding layer on the third insulating layer, wherein an etching rate of the first insulating layer is greater than an etching rate of the second insulating layer, and wherein the etching rate of the second insulating layer is greater than an etching rate of the third insulating layer.

According to an embodiment of the present disclosure, before forming the first insulating layer, the method further includes forming a lower third insulating layer, and forming a lower second insulating layer on the lower third insulating layer, wherein the first insulating layer is formed on the lower second insulating layer.

According to an embodiment of the present disclosure, the first insulating layer is formed by a silicon nitride, the second insulating layer is formed by a silicon oxynitride, and the third insulating layer is formed by a silicon oxide. Alternatively, the first insulating layer is formed by a silicon nitride, the second insulating layer and the lower second insulating layer are formed by a silicon oxynitride, and the third insulating layer and the lower third insulating layer are formed by a silicon oxide.

According to an embodiment of the present disclosure, the method for manufacturing the display substrate further includes forming a blocking layer between the black matrix and an encapsulation layer to prevent the encapsulation layer being etched by a dry etch process, wherein the encapsulation layer is disposed under the black matrix to encapsulate an organic light emitting diode.

According to an embodiment of the present disclosure, the method for manufacturing the display substrate further includes forming an absorbing layer on the black matrix to absorb at least one of an organic solvent, water and/or a liquid for forming sub-pixels.

According to an embodiment of the present disclosure, during the formation of a color film, since the sidewall of the black matrix is formed as a concave curved surface, color film droplets in one sub-pixel may return into the sub-pixel along the curved surface when splashing to the sidewall of the black matrix, so as to avoid the contamination to adjacent pixels caused by the droplets splashing, and thereby ensure a yield of the substrate.

BRIEF DESCRIPTION OF THE DRAWINGS

In order to illustrate the technical solutions in embodiments of the present disclosure or in the prior art more clearly, the following drawings to be used in the description of the embodiments or of the prior art will be briefly introduced below. Apparently, the drawings in the following description are only for some embodiments of the present disclosure, and those of ordinary skill in the art may also obtain other drawings from these drawings without creative efforts.

DETAILED DESCRIPTION

Figure 1:
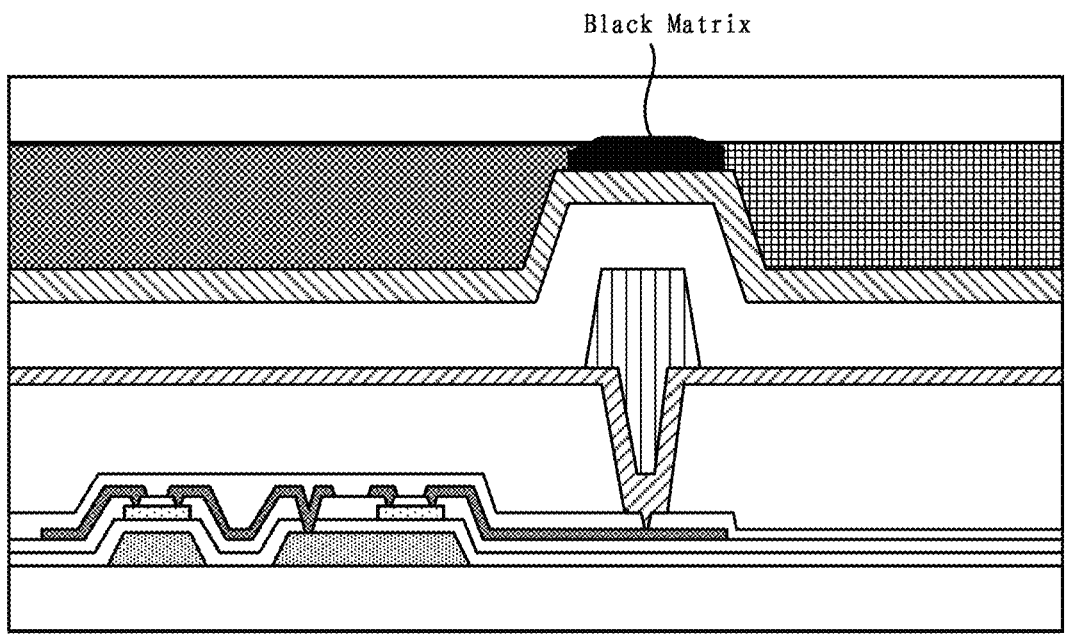
FIG. 1 is a schematic view illustrating a structure of a black matrix in the prior art.
Figure 2:
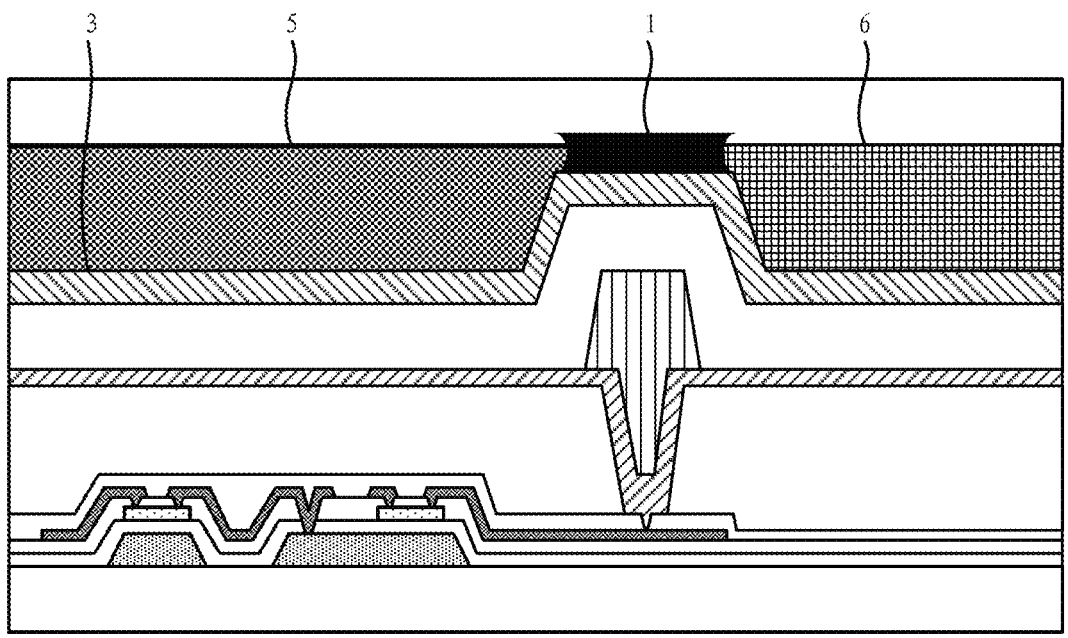
FIG. 2 is a schematic view illustrating a structure of a display substrate according to one embodiment of the present disclosure.

The technical solution in embodiments of the present disclosure will be clearly and completely described in combination with the drawings in the embodiments of the present disclosure. Apparently, the described embodiments are merely part of the embodiments of the present disclosure, instead of all the embodiments. All other embodiments obtained by those skilled in the art based on the embodiments of the present disclosure without creative work fall within the scope of the disclosure. As shown in FIG. 2, a display substrate according to one embodiment of the present disclosure includes a black matrix 1 disposed between adjacent pixels, in which the black matrix 1 has a sidewall of a concave curved surface.

During the formation of a color film, since the sidewall of the black matrix is a concave curved surface, color film droplets in sub-pixels of a first pixel region 5 may return into the sub-pixels along the curved surface and will not enter into sub-pixels of a second pixel region 6 while splashing to the sidewall of the black matrix 1. Accordingly, the contamination to the first pixel region 5 can also be avoided when droplets are dropped into the sub-pixels of the second pixel region 6.

Figure 3:
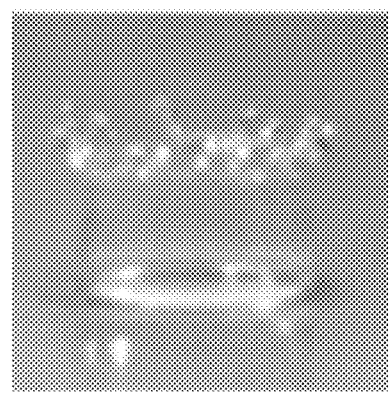
FIG. 3 is a schematic view illustrating droplets splashing in the prior art.
Figure 4:
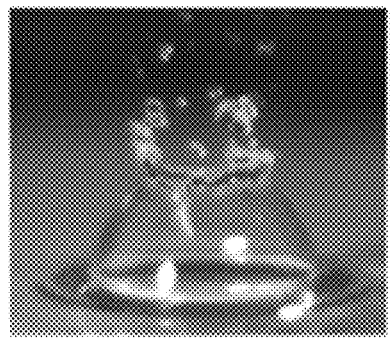
FIG. 4 is a schematic view illustrating droplets splashing according to one embodiment of the present disclosure.

The droplets splashing according to an embodiment of the present disclosure is shown in FIG. 4. Compared with the droplets splashing in the prior art (as shown in FIG. 3), according to an embodiment of the present disclosure, the droplets splashing has a reduced range and a decreased height, so as to ensure pure color of each sub-pixel in the formed color film, thereby improving the display effect and ensuring the yield of the substrate.

It is to be noted that, in addition to the black matrix 1, the display substrate in the present embodiment further includes a thin film transistor. Specifically, the display substrate according to an embodiment of the present disclosure may include a gate electrode, a gate insulating layer, an active layer, an etching blocking layer, a source electrode, a drain electrode, a passivation layer and the like, and may further include an organic light emitting layer, which will not be repeated here.

According to an embodiment of the present disclosure, a material of the black matrix 1 includes a negative photoresist.

The patterns of the black matrix 1 may be formed by a UV (ultraviolet light) irradiation, and regions of the negative photoresist irradiated by UV may be cured and remained. When forming the black matrix 1, since holes for exposure on a mask film are very small, light diffraction may occur, and thus a larger area of the material of the black matrix is irradiated, thereby a larger area (which is greater than the area of the holes for exposure) of the black matrix 1 is cured. The material of the black matrix has a strong barrier effect on light, and the diffracted light is difficult to transmit into the deeper black matrix material. Therefore, the deeper black matrix material can only be cured into a black matrix with an area equivalent to that of the holes for exposure.

The lowermost portion of the material of the black matrix has a higher amount of heat due to contacting with a heating plate (which is used to dry the organic solvent during the exposure), such that the organic solvent evaporates more quickly and more material of the black matrix remains. Therefore, a wider black matrix can be formed through the exposure, and thus the sidewall of a concave curved surface having wider upper and lower portions and a narrower middle portion is formed.

Figure 5:
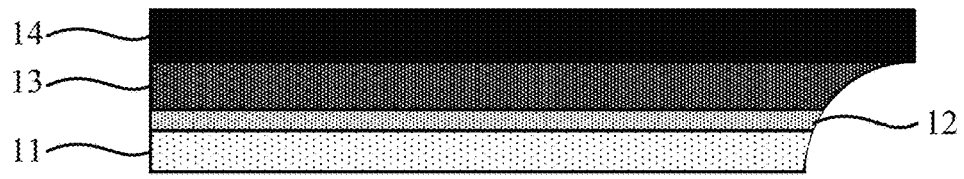
FIG. 5 is a schematic view illustrating a structure of a black matrix according to one embodiment of the present disclosure.

As shown in FIG. 5, the black matrix 1 according to an embodiment of the present disclosure includes a first insulating layer 11, a second insulating layer 12 disposed on the first insulating layer 11, a third insulating layer 13 disposed on the second insulating layer 12, and a light shielding layer 14 disposed on the third insulating layer 13. An etching rate of the first insulating layer 11 is greater than an etching rate of the second insulating layer 12, and the etching rate of the second insulating layer 12 is greater than an etching rate of the third insulating layer 13, so as to form a curved surface as shown on the right side of FIG. 5.

According to an embodiment of the present disclosure, the material of the first insulating layer 11 may be a silicon nitride SiNX, and the etching rate of the first insulating layer 11 is 30 Angstroms (Å)/second, the material of the second insulating layer 12 may be a silicon oxynitride SiOYNX, and the etching rate of the second insulating layer 12 is between 10 Å/second to 30 Å/second, and the material of the third insulating layer 13 may be a silicon oxide SiOX, and the etching rate of the third insulating layer 13 is 10 Å/second. Since the etching rate of the first insulating layer 11 is fastest, the etching rate of the third insulating layer 13 is slowest, and the etching rate of the second insulating layer 12 is between the above two, when an etching is performed, the first insulating layer 11 is etched to the deepest depth, the third insulating layer 13 is etched to the shallowest depth and the second insulating layer 12 is etched to a depth between the deepest depth and the shallowest depth, such that a sidewall recessed from the third insulating layer 13 toward the first insulating layer 11 is formed.

Figure 6:
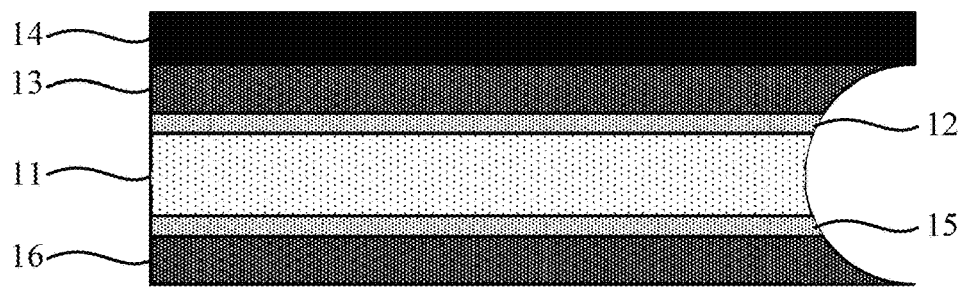
FIG. 6 is a schematic view illustrating a structure of a black matrix according to another embodiment of the present disclosure.

As shown in FIG. 6, the black matrix 1 according to an embodiment of the present disclosure further includes a lower second insulating layer 15 disposed under the first insulating layer 11, and a lower third insulating layer 16 disposed under the lower second insulating layer 15.

According to an embodiment of the present disclosure, the lower second insulating layer 15 and the second insulating layer 12 may be formed by same materials, and the lower third insulating layer 16 and the third insulating layer 13 may be formed by same materials.

The lower second insulating layer 15 and the lower third insulating layer 16 may be formed with a sidewall recessed from down to up. The sides of the lower second insulating layer 15 and the lower third insulating layer 16 together with the sides of the first insulating layer 11, the second insulating layer 12 and the third insulating layer 13 may form a more rounded sidewall, so as to ensure that the droplets can still flow back to the target sub-pixel along the sidewall after splashing, thereby ensuring the color of the target sub-pixel.

According to an embodiment of the present disclosure, the first insulating layer 11, the second insulating layer 12 and the third insulating layer 13 may be etched by a dry etching process, or the first insulating layer 11, the second insulating layer 12, the third insulating layer 13, the lower second insulating layer 15 and the lower third insulating layer 16 may be etched by a dry etching process.

The dry etching process may be performed through a gas. In addition to etching the surface of the black matrix, the sidewalls of the black matrix 1 may be etched.

Figure 7:
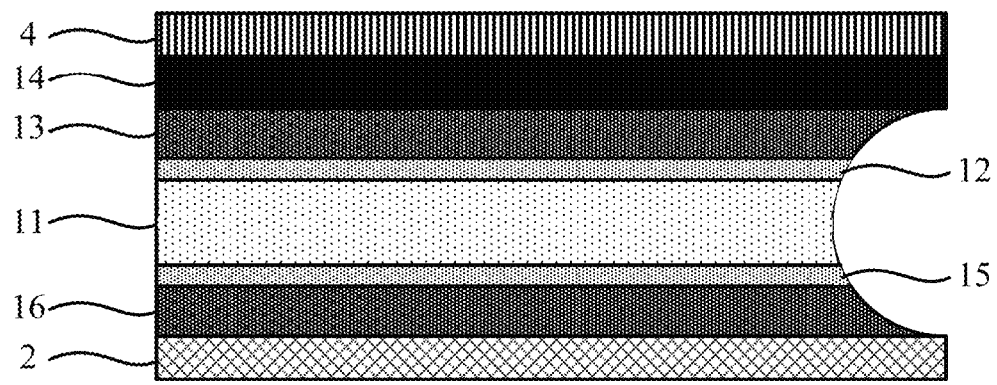
FIG. 7 is a schematic view illustrating a structure of a black matrix according to yet another embodiment of the present disclosure.

As shown in FIG. 7, according to an embodiment of the present disclosure, the display substrate formed with the black matrix 1 described as above may further include an encapsulation layer 3 disposed under the black matrix 1 for encapsulating an organic light emitting diode, and a blocking layer 2 disposed between the black matrix 1 and the encapsulation layer 3 for preventing the encapsulation layer 3 from being etched by the dry etching process.

By providing the blocking layer 2, it is possible to avoid the encapsulation layer 3 from being etched by the dry etching gas, so as to facilitate the protection to the internal structure of the encapsulation.

According to an embodiment of the present disclosure, the display substrate formed with the black matrix 1 described as above may further include an absorbing layer 4 disposed on the black matrix 1 for absorbing an organic solvent, water and/or a liquid for forming sub-pixels.

By providing the absorbing layer 4, it is possible to ensure that the droplets sputtered on the black matrix 1 can also be absorbed, so as to further avoid the contamination to other sub-pixels caused by sputtering.

According to an embodiment of the present disclosure, a display device including the display substrate described as above is also provided.

It is to be noted that the display device in the present embodiment may be any product or component having a display function such as an electronic paper, a mobile phone, a tablet computer, a television set, a notebook computer, a digital photo frame, a navigator or the like.

A method for manufacturing a display substrate according to one embodiment of the present disclosure includes forming a black matrix 1 between adjacent pixels, such that a sidewall of the black matrix 1 is a concave curved surface.

According to an embodiment of the present disclosure, forming the black matrix 1 between adjacent pixels includes forming a black matrix layer using a negative photoresist, heating the black matrix layer to dry an organic solvent in the black matrix layer, exposing the black matrix layer; and developing the black matrix layer to form the black matrix 1.

Figure 8:
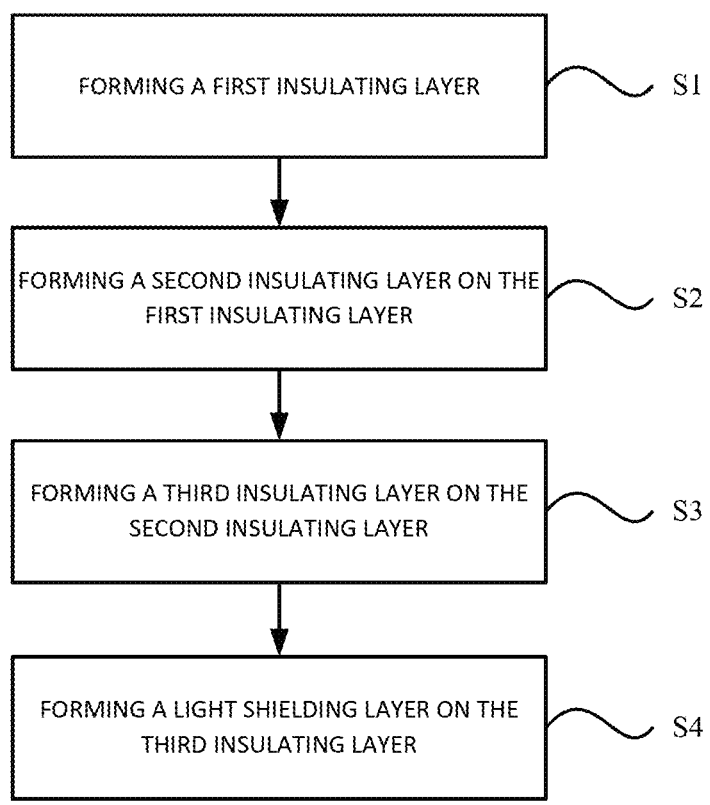
FIG. 8 is a flowchart illustrating a method for manufacturing a display substrate according to one embodiment of the present disclosure.

As shown in FIG. 8, forming the black matrix 1 between adjacent pixels includes S1, forming a first insulating layer 11, S2, forming a second insulating layer 12 on the first insulating layer 11, S3, forming a third insulating layer 13 on the second insulating layer 12, and S4, forming a light shielding layer 14 on the third insulating layer 13, wherein an etching rate of the first insulating layer 11 is greater than an etching rate of the second insulating layer 12, and the etching rate of the second insulating layer 12 is greater than an etching rate of the third insulating layer 13.

According to an embodiment of the present disclosure, before forming the first insulating layer 11, the method further includes forming a lower third insulating layer 16, and forming a lower second insulating layer 15 on the lower third insulating layer 16, wherein the first insulating layer 11 is formed on the lower second insulating layer 15.

According to an embodiment of the present disclosure, forming the display substrate may further include forming a blocking layer 2 between the black matrix 1 and the encapsulation layer 3 to prevent the encapsulation layer 3 from being etched by a dry etching process, wherein the encapsulation layer 3 is disposed under the black matrix 1 to encapsulate an organic light emitting diode.

According to an embodiment of the present disclosure, forming the display substrate may further include forming an absorbing layer 4 on the black matrix 1 to absorb an organic solvent, water and/or a liquid for forming sub-pixels.

According to an embodiment of the present disclosure, the forming process employed in the processes described as above may include, for example, a film forming process such as deposition, sputtering and the like, and/or a patterning process such as etching.

The technical solution of the present disclosure has been described above in detail with reference to the accompanying drawings. It is considered that, in the prior art, during the process of fabricating a color film, droplets for forming sub-pixels may be sputtered into sub-pixels of other pixel regions, which may cause the contamination to the other sub-pixels. According to the technical solution of the present disclosure, during the formation of a color film, since the sidewall of the black matrix is formed into a concave curved surface, color film droplets in one sub-pixel may return into the sub-pixel along the curved surface while splashing to the sidewall of the black matrix, so as to avoid the contamination to adjacent pixels caused by the droplets splashing, thereby ensuring a yield of the substrate.

It is to be noted that the dimensions of the layers and regions in the drawings may be exaggerated for clarity of illustration. It is also to be understood that when an element or layer is referred to as being "on" another element or layer, it may be directly on the other element, or intervening layers may be present. In addition, it will be understood that when an element or layer is referred to as being "under" another element or layer, it may be directly under the other element, or more than one intervening layer or element may be present. In addition, it will also be understood that when a layer or element is referred to as being "between" two layers or two elements, it may be a single layer between the two layers or the two elements, or more than one intervening layer or element may be present.

In the present disclosure, the terms "first", "second" and "third" are used for purposes of illustration only and are not to be taken as an indication or suggestion of relative importance. The term "a plurality of" refers to two or more than two, unless otherwise specifically defined.

The foregoing are only example embodiments of the disclosure and are not intended to limit the disclosure, and those skilled in the art will understand that various changes and modifications may be made therein. Any modifications, equivalent substitutions, improvements and the like within the spirit and principles of the disclosure are intended to be included within the scope of the disclosure.

What is claimed is:

1. A display substrate, comprising:
   a black matrix disposed between adjacent pixels, wherein a sidewall of the black matrix is a concave curved surface, and
   wherein the black matrix comprises:
      a first insulating layer;
      a second insulating layer disposed above the first insulating layer;
      a third insulating layer disposed above the second insulating layer;
      a light shielding layer disposed on the third insulating layer, wherein an etching rate of the first insulating layer is greater than an etching rate of the second insulating layer, and wherein the etching rate of the second insulating layer is greater than an etching rate of the third insulating layer;
      a lower second insulating layer disposed under the first insulating layer; and
      a lower third insulating layer disposed under the lower second insulating layer, wherein the lower second insulating layer and the second insulating layer are formed by same materials, and the lower third insulating layer and the third insulating layer are formed by same materials.

2. The display substrate of claim 1, wherein i) the first insulating layer, the second insulating layer, and the third insulating layer are etched by a dry etching process, or ii) the first insulating layer, the second insulating layer, the third insulating layer, the lower second insulating layer, and the lower third insulating layer are etched by a dry etching process.

3. The display substrate of claim 1, wherein the first insulating layer is formed by a silicon nitride, the second insulating layer and the lower second insulating layer are formed by a silicon oxynitride, and the third insulating layer and the lower third insulating layer are formed by a silicon oxide.

4. The display substrate of claim 1, further comprising:
   an encapsulation layer disposed under the black matrix for encapsulating an organic light emitting diode; and
   a blocking layer disposed between the black matrix and the encapsulation layer for preventing the encapsulation layer from being etched by a dry etching process.

5. The display substrate of claim 1, further comprising:
   an absorbing layer disposed on the black matrix for absorbing an organic solvent, water and/or a liquid for forming sub-pixels.

6. A display device, comprising the display substrate of claim 1.

7. A method for manufacturing a display substrate, comprising:
   forming a black matrix between adjacent pixels, such that a sidewall of the black matrix is a concave curved surface, and
   wherein forming the black matrix between adjacent pixels comprises:
      forming a first insulating layer;
      forming a second insulating layer above the first insulating layer;
      forming a third insulating layer above the second insulating layer;
      forming a light shielding layer on the third insulating layer, wherein an etching rate of the first insulating layer is greater than an etching rate of the second insulating layer, and wherein the etching rate of the second insulating layer is greater than an etching rate of the third insulating layer,
      forming a lower third insulating layer; and
      forming a lower second insulating layer on the lower third insulating layer, wherein the first insulating layer is formed on the lower second insulating layer, wherein the lower second insulating layer and the second insulating layer are formed by same materials, and the lower third insulating layer and the third insulating layer are formed by same materials.

8. The method of claim 7, wherein the first insulating layer is formed by a silicon nitride, the second insulating layer and the lower second insulating layer are formed by a silicon oxynitride, and the third insulating layer and the lower third insulating layer are formed by a silicon oxide.

9. The method of claim 7, further comprising:
   forming a blocking layer between the black matrix and an encapsulation layer to prevent the encapsulation layer from being etched by a dry etching process, wherein the encapsulation layer is disposed under the black matrix to encapsulate an organic light emitting diode.

10. The method of claim 7, further comprising:
    forming an absorbing layer on the black matrix to absorb at least one of an organic solvent, water, and a liquid for forming sub-pixels.

* * * * *